(12) United States Patent
Chong et al.

(10) Patent No.: US 9,912,315 B2
(45) Date of Patent: Mar. 6, 2018

(54) COMPOSITE ELECTRONIC COMPONENT AND BOARD HAVING THE SAME

(71) Applicant: SAMSUNG ELECTRO-MECHANICS CO., LTD., Suwon-Si, Gyeonggi-Do (KR)

(72) Inventors: Won Sik Chong, Suwon-Si (KR); Jong Young Kim, Suwon-Si (KR)

(73) Assignee: SAMSUNG ELECTRO-MECHANICS CO., LTD., Suwon-Si, Gyeonggi-Do (KR)

( * ) Notice: Subject to any disclaimer, the term of this patent is extended or adjusted under 35 U.S.C. 154(b) by 175 days.

(21) Appl. No.: 14/878,931

(22) Filed: Oct. 8, 2015

(65) Prior Publication Data

US 2016/0142034 A1    May 19, 2016

(30) Foreign Application Priority Data

Nov. 14, 2014  (KR) .................. 10-2014-0158503

(51) Int. Cl.
  *H03H 7/06*      (2006.01)
  *H03H 1/00*      (2006.01)

(52) U.S. Cl.
  CPC ....... *H03H 7/06* (2013.01); *H03H 2001/0085* (2013.01)

(58) Field of Classification Search
  CPC .......................... H03H 2001/0085; H03H 7/06

USPC ................ 333/185, 172; 174/260; 29/25.03; 361/301.4
See application file for complete search history.

(56) References Cited

U.S. PATENT DOCUMENTS

| 8,243,406 | B2 * | 8/2012 | Asakura ................. H01T 4/08 361/118 |
| 2003/0030510 | A1 | 2/2003 | Sasaki et al. |
| 2004/0263284 | A1 | 12/2004 | Terakawa et al. |
| 2014/0306787 | A1 * | 10/2014 | Kato ................... H01F 17/0013 336/105 |

FOREIGN PATENT DOCUMENTS

| JP | 2005-020448 A | 1/2005 |
| JP | 2005-317725 A | 11/2005 |
| JP | 2006-013713 A | 1/2006 |
| KR | 2003-0014586 A | 2/2003 |
| KR | 10-2005-0082799 A | 8/2005 |

* cited by examiner

*Primary Examiner* — Benny Lee
*Assistant Examiner* — Hafizur Rahman
(74) *Attorney, Agent, or Firm* — McDermott Will & Emery LLP

(57) ABSTRACT

A composite electronic component includes a composite body including a common mode filter and a resistor that are coupled to each other, the common mode filter including a common mode choke coil; and a plurality of input terminals disposed on a first side surface of the composite body, a plurality of output terminals, and a ground terminal.

16 Claims, 4 Drawing Sheets

COMPOSITE ELECTRONIC COMPONENT AND BOARD HAVING THE SAME

CROSS-REFERENCE TO RELATED APPLICATION

This application claims the benefit of priority to Korean Patent Application No. 10-2014-0158503, filed on Nov. 14, 2014 with the Korean Intellectual Property Office, the entirety of which is incorporated herein by reference.

BACKGROUND

The present disclosure relates to a composite electronic component including a plurality of passive elements and a board having the same.

In accordance with recent demand for thinness and lightness of electronic devices, as well as improved performance, electronic devices are required to have significantly decreased size and various functions.

Among these electronic devices, in a tablet liquid crystal display (LCD) to which a differential transmission scheme is applied, a common mode filter (CMF) for removing common mode noise has been used.

In addition, a resistor R for a differential filter has been used in series and in parallel with the common mode filter (CMF) as a filter for differential transmission.

However, since electronic devices perform various functions, the number of common mode filters (CMF) and resistors R has increased, and the number of other passive elements has also increased.

In this case, the component disposition area of electronic devices must be increased, which may limit miniaturization of electronic devices.

Therefore, research into technology for decreasing the component disposition area of electronic devices and manufacturing costs is still ongoing.

SUMMARY

One aspect of the present disclosure may provide a composite electronic component having a reduced component mounting area in a tablet LCD to which a differential transmission scheme is applied, and a board having the same.

An aspect of the present disclosure may also provide a composite electronic component for removing common mode noise in a tablet LCD to which a differential transmission scheme is applied, and a board having the same.

According to an aspect of the present disclosure, a composite electronic component may comprise a composite body including a common mode filter and a resistor that are coupled to each other, the common mode filter including a common mode choke coil; and a plurality of input terminals disposed on a first side surface of the composite body, a plurality of output terminals, and a ground terminal.

The resistor may be an array resistor including a plurality of resistors.

The plurality of input terminals may include first and second input terminals disposed to be spaced apart from each other, each being connected to the common mode choke coil.

The plurality of output terminals may include first and second output terminals disposed to be spaced apart from each other on a second side surface of the common mode filter and third and fourth output terminals disposed on both end surfaces of the resistor, the first and second output terminals each being connected to the common mode choke coil.

The ground terminal may be disposed on a side surface of the resistor.

The common mode filter and the resistor may be coupled to each other by a conductive adhesive.

The resistor may be coupled to a side surface of the common mode filter.

According to another aspect of the present disclosure, a board having a composite electronic component may comprise a printed circuit board having a plurality of electrode pads; the composite electronic component mounted on the printed circuit board; and solders connecting the electrode pads and the composite electronic component, wherein the composite electronic component includes a composite body including a common mode filter and a resistor that are coupled to each other, the common mode filter including a common mode choke coil; and a plurality of input terminals disposed on a first side surface of the composite body, a plurality of output terminals, and a ground terminal.

The first and third output terminals may be disposed on one electrode pad, and the second and fourth output terminals are disposed on another electrode pad.

BRIEF DESCRIPTION OF DRAWINGS

The above and other aspects, features and advantages of the present disclosure will be more clearly understood from the following detailed description taken in conjunction with the accompanying drawings.

DETAILED DESCRIPTION

Figure 1:
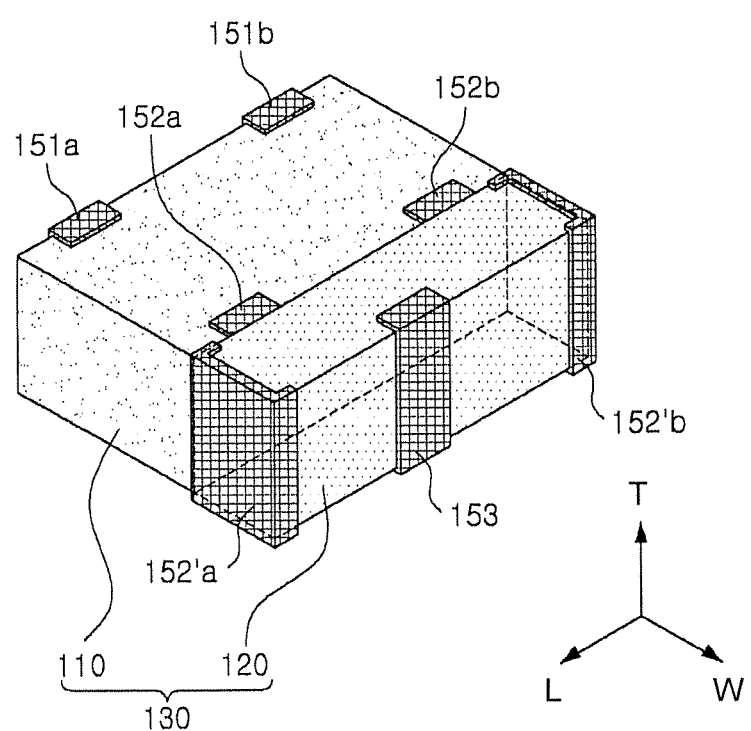
FIG. 1 is a perspective diagram schematically illustrating a composite electronic component according to an exemplary embodiment in the present disclosure.

Hereinafter, embodiments of the present disclosure will be described in detail with reference to the accompanying drawings. The disclosure may, however, be embodied in many different forms and should not be construed as being limited to the embodiments set forth herein. Rather, these embodiments are provided so that this disclosure will be thorough and complete, and will fully convey the scope of the disclosure to those skilled in the art. In the drawings, the shapes and dimensions of elements may be exaggerated for clarity, and the same reference numerals will be used throughout to designate the same or like elements.

Composite Electronic Component

FIG. 1 is a perspective diagram schematically illustrating a composite electronic component according to an exemplary embodiment in the present disclosure.

Referring to FIG. 1, in the composite electronic component, according to the exemplary embodiment in the present disclosure, a 'length direction' refers to an 'L' direction of FIG. 1, a 'width direction' refers to a 'W' direction of FIG. 1, and a 'thickness direction' refers to a 'T' direction of FIG. 1.

Meanwhile, the length, width, and thickness directions of the composite electronic component may be the same as length, width, and thickness directions of a common mode filter and a resistor, respectively, as described below.

In addition, in the exemplary embodiment of the present disclosure, the composite electronic component may have upper and lower surfaces opposing each other, first and second end surfaces in the length direction and first and second side surfaces in the width direction that connect the upper and lower surfaces to each other. A shape of the composite electronic component is not particularly limited, but may be hexahedral, as shown.

Further, the first and second end surfaces of the composite electronic component in the length direction and the first and second side surfaces thereof in the width direction may be defined as surfaces in the same directions as directions of first and second end surfaces of the common mode filter and the resistor in the length direction and first and second side surfaces of the common mode filter and the resistor in the width direction, respectively, as described below.

However, as illustrated in FIG. 1, the second side surface of the common mode filter in the width direction and the first side surface of the resistor may be coupling surfaces coupled to each other.

Meanwhile, in the composite electronic component, the common mode filter and the resistor may be coupled to each other, and in a case in which the resistor is coupled to the side surface of the common mode filter, the upper surface of the composite electronic component may be defined as upper surfaces of the common mode filter and the resistor, and the lower surface of the composite electronic component may be defined as lower surfaces of the common mode filter and the resistor.

In addition, the upper and lower surfaces may correspond to surfaces of the composite electronic component opposing each other in the thickness direction.

Referring to FIG. 1, the composite electronic component, according to the exemplary embodiment in the present disclosure, may include a composite body 130 in which a common mode filter 110 including a common mode choke coil and a resistor 120 are coupled to each other.

A shape of the composite body 130 is not particularly limited, but may be hexahedral, as shown.

The composite body 130 may be formed by coupling the common mode filter 110 and the resistor 120, and a method of forming the composite body 130 is not particularly limited.

For example, the composite body 130 may be formed by coupling the separately manufactured common mode filter 110 and resistor 120 to each other using a conductive adhesive, a resin, or the like, but the method of forming the composite body 130 is not particularly limited thereto.

In detail, the adhesive or resin used to couple the common mode filter 110 and the resistor 120 to each other may contain, for example, an epoxy resin, but is not limited thereto.

A method of coupling the common mode filter 110 and the resistor 120 to each other using the conductive adhesive, the resin, or the like, is not particularly limited. For example, the common mode filter 110 and the resistor 120 may be coupled to each other by applying, heating, and curing the conductive adhesive, the resin, or the like, onto the coupling surface of the common mode filter 110 or the resistor 120.

Meanwhile, according to an exemplary embodiment in the present disclosure, the common mode filter 110 may be coupled to the side surface of the resistor 120, but is not limited thereto. In other words, the common mode filter 110 may be variously disposed.

Hereinafter, the common mode filter 110 and the resistor 120 configuring the composite body 130 will be described in detail.

According to an exemplary embodiment in the present disclosure, a body configuring the common mode filter 110 may contain the common mode choke coil (not illustrated).

The common mode filter 110 is not particularly limited. For example, any filter may be used as long as it is a filter for removing common mode noise in an application to which a differential transmission scheme is applied.

The common mode filter 110 may have a structure including the body in which the common mode choke coil (not illustrated) is included and a magnetic material or ceramic is provided and terminal electrodes are disposed on outer peripheral surfaces thereof.

For the magnetic material, a Ni—Cu—Zn based ferrite material, a Ni—Cu—Zn—Mg based ferrite material, or a Mn—Zn based ferrite material may be used. However, the magnetic material is not limited thereto.

The common mode choke coil may have four exposed portions exposed to both side surfaces of the body of the common mode filter 110 in the width direction.

The four exposed portions may be connected to first and second input terminals 151a and 151b and first and second output terminals 152a and 152b, respectively, as described below.

Meanwhile, the resistor 120 may have a structure including a resistor body and terminal electrodes disposed on outer peripheral surfaces of the resistor body.

In the composite electronic component, the terminal electrodes may become third and fourth output terminals 152'a and 152'b and a ground terminal 153, and the resistor 120 may be an array resistor including a plurality of resistors.

In detail, the single resistor 120 may have three terminals, the third and fourth output terminals 152'a and 152'b and the ground terminal 153, and have one resistance part between the third output terminal 152'a and the ground terminal 153, and another resistance part between the fourth output terminal 152'b and the ground terminal 153.

The resistor 120, having two resistance parts as described above, may adjust current flow in a circuit and serve as a differential filter.

In general, a circuit formed on a board may use a resistor in order to adjust current, and use two or more resistor elements or an array resistor in which each of the resistance parts is connected to a pair of independent terminals in order to prevent the circuit from being damaged by external impact (surge, static electricity, or the like). However, in a case in which two or more resistor elements or the array resistor are used, according to the related art, mounting space may be increased.

According to an exemplary embodiment in the present disclosure, the single resistor 120 may include three terminals 152'a, 152'b, and 153 and two resistance parts disposed between two terminals, such that spatial efficiency may be increased by decreasing a space of a board in which a resistor element is disposed as compared to the case of using two resistor elements including one resistance part, respectively, or the array resistor in which each of the resistance parts is connected to the pair of independent terminals, thereby implementing miniaturization and precision of a device using the resistor element.

In detail, a three-terminal resistor 120 composed of two resistance parts, one ground terminal 153, and two unique terminals 152'a and 152'b of respective first and second resistance parts may be implemented, which results in substantially decreasing the number of terminals by one, thereby implementing a small-sized resistor 120.

The resistor body may contain Ag, Pd, Cu, Ni, a Cu—Ni based alloy, a Ni—Cr based alloy, a Ru oxide, a Si oxide, Mn and Mn based alloys, or the like, as a main ingredient, and may contain various materials depending on a required resistance value.

Meanwhile, the resistor body itself may be manufactured by using the resistance material, but the resistor body may have a structure composed of a base substrate and a resistance layer disposed on one surface of the base substrate.

The base substrate, which supports the resistance layer and secures the strength of the resistor 120, is not particularly limited. For example, an aluminum substrate or insulating substrate may be used as the base substrate.

Although not limited thereto, the base substrate may be formed of a thin plate having a rectangular parallelepiped shape and formed of an alumina material of which a surface is anodized to thereby be insulated.

Furthermore, as the base substrate may be formed of a material having excellent heat conductivity, the base substrate may serve as a heat diffusion path through which heat generated in the resistance layer at the time of using the resistor element may be externally emitted.

The resistance layer may be disposed on one surface of the base substrate and include the above-mentioned first and second resistance parts.

According to an exemplary embodiment in the present disclosure, the first and second resistance parts may be formed as a single integrated resistance layer.

The composite electronic component may include the input terminals 151a and 151b disposed on the side surface of the composite body 130, the output terminals 152a, 152b, 152'a, and 152'b, and the ground terminal 153.

The input terminals 151a and 151b may include the first and second input terminals 151a and 151b disposed to be spaced apart from each other on the first side surface of the common mode filter 110 in the width direction, and be connected to the common mode choke coil.

The first side surface of the common mode filter 110 in the width direction may be the same as the first side surface of the composite electronic component in the width direction.

The output terminals 152a, 152b, 152'a, and 152'b may include the first and second output terminals 152a and 152b disposed to be spaced apart from each other on the second side surface of the common mode filter 110 in the width direction and the third and fourth output terminals 152'a, and 152'b disposed on both end surfaces of the resistor 120 in the length direction, and the first and second output terminals 152a and 152b may be connected to the common mode choke coil.

The second side surface of the common mode filter 110 in the width direction may refer to the coupling surface of the common mode filter 110 coupled to the resistor 120.

The composite electronic component, according to an exemplary embodiment in the present disclosure, may be used in a tablet LCD to which a differential transmission scheme is applied, and thus, the first input terminal 151a and the first output terminal 152a may be connected to the common mode choke coil of the common mode filter 110 to thereby serve as one coil part in the composite electronic component.

Meanwhile, the second input terminal 151b and the second output terminal 152b may be connected to the common mode choke coil of the common mode filter 110 to thereby serve as the other coil part in the composite electronic component.

The first output terminal 152a disposed on the second side surface of the common mode filter 110 in the width direction and the third output terminal 152'a disposed on one end surface of the resistor 120 in the length direction may be disposed on one electrode pad as described below at the time of mounting the composite electronic component on a printed circuit board, such that the first output terminal 152a and the third output terminal 152'a may be electrically connected to each other.

Similarly, the second output terminal 152b disposed on the second side surface of the common mode filter 110 in the width direction and the fourth output terminal 152'b disposed on the other end surface of the resistor 120 in the length direction may be disposed on another electrode pad as described below at the time of mounting the composite electronic component on a printed circuit board, such that the second output terminal 152b and the fourth output terminal 152'b may be electrically connected to each other.

The ground terminal 153 may be disposed on the side surface of the resistor 120 in the width direction.

The side surface of the resistor 120 in the width direction may mean the surface of the resistor 120 opposing the coupling surface of the resistor 120 coupled to the common mode filter 110.

The input terminals 151a and 151b, the output terminals 152a, 152b, 152'a, and 152'b, and the ground terminal 153 may be formed of a conductive paste containing a conductive metal.

The conductive metal may be nickel (Ni), copper (Cu), tin (Sn), or an alloy thereof, but is not limited thereto.

The conductive paste may further contain an insulating material. The insulating material may be, for example, glass, but is not limited thereto.

A method of forming input terminals 151a and 151b, the output terminals 152a, 152b, 152'a, and 152'b, and the ground terminal 153 is not particularly limited. In detail, the input terminals 151a and 151b, the output terminals 152a, 152b, 152'a, and 152'b, and the ground terminal 153 may be formed by dipping method of a composite body or may be formed by a printing method, a plating method, or the like.

Figure 2:
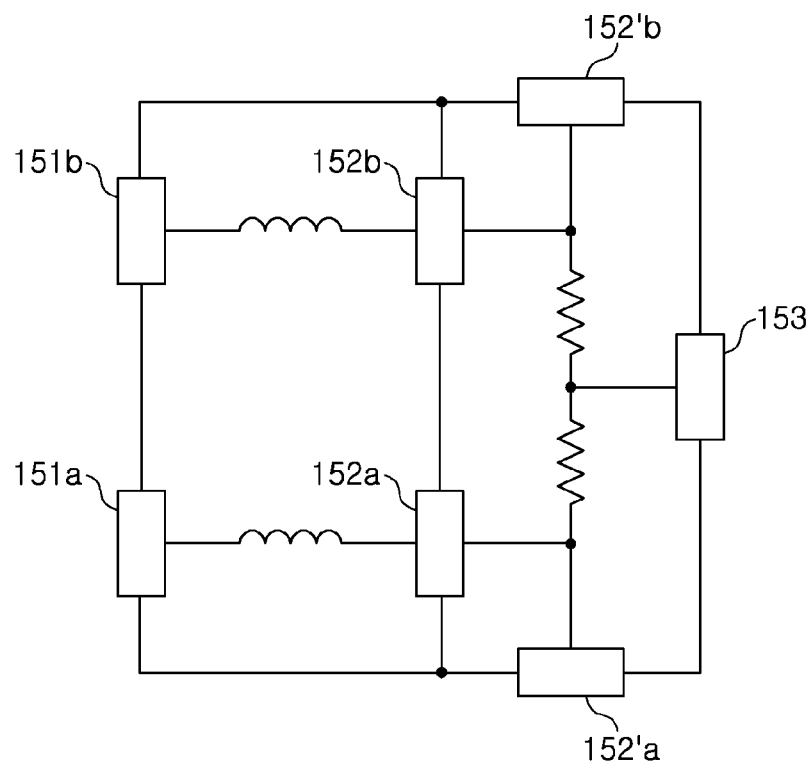
FIG. 2 is an equivalent circuit diagram of the composite electronic component illustrated in FIG. 1.

FIG. 2 is an equivalent circuit diagram of the composite electronic component illustrated in FIG. 1.

Referring to FIG. 2, in the composite electronic component, according to an exemplary embodiment in the present disclosure, the resistor 120 and the common mode filter 110 may be coupled to each other unlike that of the related art.

In detail, the first input terminal 151a and the first output terminal 152a may be connected to a common mode choke coil of the common mode filter 110, and the second input terminal 151b and the second output terminal 152b may be connected to a common mode choke coil of the common mode filter 110, such that the composite electronic component may serve as the common mode filter.

Further, the resistor 120 connected in series and in parallel with the common mode filter 110 may be coupled to the side surface of the common mode filter 110, such that the composite electronic component may simultaneously serve as the common mode filter (CMF) and a resistor R as a single component.

In detail, unlike that of the related art, in the composite electronic component, according to the exemplary embodiment in the present disclosure, the resistor 120 and the common mode filter 110 may be coupled to each other, such that a mounting area of the tablet LCD to which the differential transmission scheme is applied may be significantly decreased, and thus, securing a mounting space may be facilitated.

Further, a manufacturing cost, such as a mounting cost, or the like, may be decreased.

Figure 3:
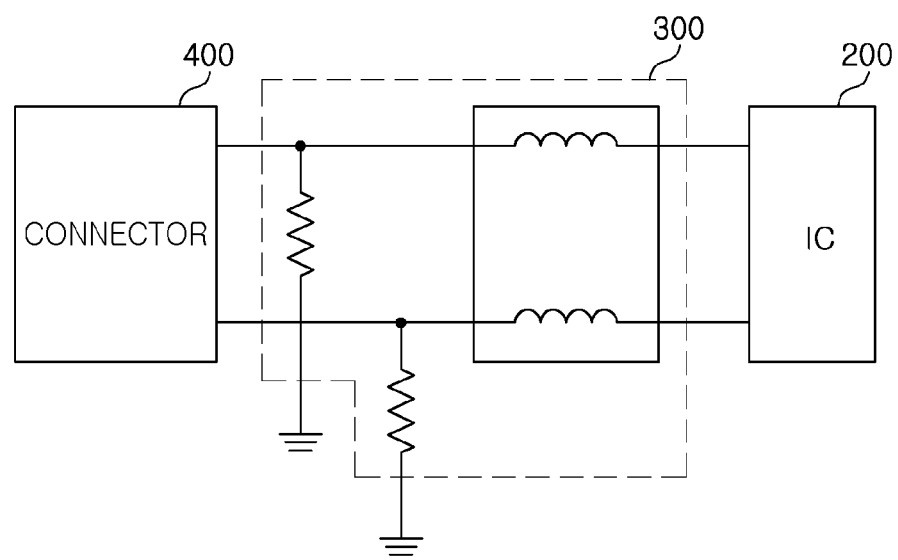
FIG. 3 is a diagram of a connection relationship of electronic components in a tablet LCD to which a differential transmission scheme is applied.

FIG. 3 is a diagram of a connection relationship of electronic components of the tablet LCD to which the differential transmission scheme is applied.

Referring to FIG. 3, the tablet LCD to which the differential transmission scheme is applied may include an integrated circuit (IC) 200, a composite electronic component 300, and a connector 400.

The IC 200, which is an active element, may transmit a signal to a common mode filter 110 of the composite electronic component 300. Here, the signal may be transmitted to the common mode filter 110 of the composite electronic component 300 by the differential transmission scheme.

The composite electronic component 300 may be composed of the common mode filter 110 and the resistor 120.

The common mode filter 110 and the resistor 120 may remove noise in a differential signal transmitted from the IC 200.

The connector 400, which receives a signal filtered in the composite electronic component 300, may serve as a mediator externally transferring the signal.

The filtered signal may be defined as a signal obtained by removing common mode noise in a differentially transmitted signal.

Figure 4:
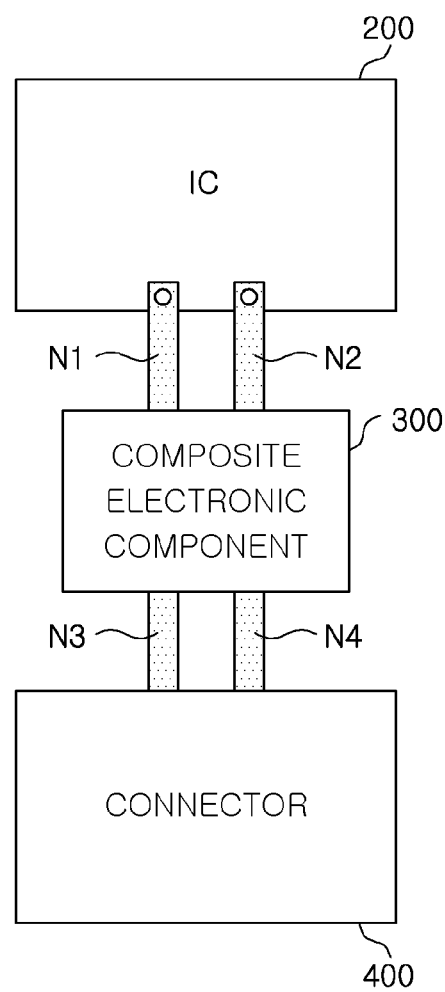
FIG. 4 is a diagram illustrating a pattern in which a system using the composite electronic component, according to an exemplary embodiment in the present disclosure, is disposed.

FIG. 4 is a diagram illustrating a pattern in which a system using the composite electronic component, according to an exemplary embodiment in the present disclosure, is disposed.

Referring to FIG. 4, it may be confirmed that the common mode filter 110 and the resistor 120 illustrated in FIG. 3 are replaced by the composite electronic component 130 according to the exemplary embodiment.

As described above, the composite electronic component may perform a noise removal function of removing common mode noise in the differentially transmitted signal.

In addition, the number of disposed elements is decreased, such that the elements may be optimally disposed.

Further, according to the exemplary embodiment in the present disclosure, the common mode filter 110 and the resistor 120 may be disposed to be as close to each other as possible, such that a wiring of a power line may be designed to be short and thick.

Therefore, noise generated when the wiring is disposed to be elongated may be decreased.

Meanwhile, in order to satisfy customers' demands, electronic device manufacturers have made efforts to decrease the size of printed circuit boards (PCBs) included in electronic devices.

Therefore, an increase in the degree of integration of integrated circuits (IC) mounted on PCBs has been required.

This requirement may be satisfied by configuring a plurality of elements as a single composite component, as in the composite electronic component according to the exemplary embodiment.

In addition, according to an exemplary embodiment in the present disclosure, two components (the common mode filter and the resistor) may be implemented as a single composite electronic component, such that the mounting area of a printed circuit board (PCB) may be decreased.

According to the present embodiment, the mounting area may be decreased by about 50% to 70% as compared to an existing disposition pattern.

Board Having Composite Electronic Component

Figure 5:
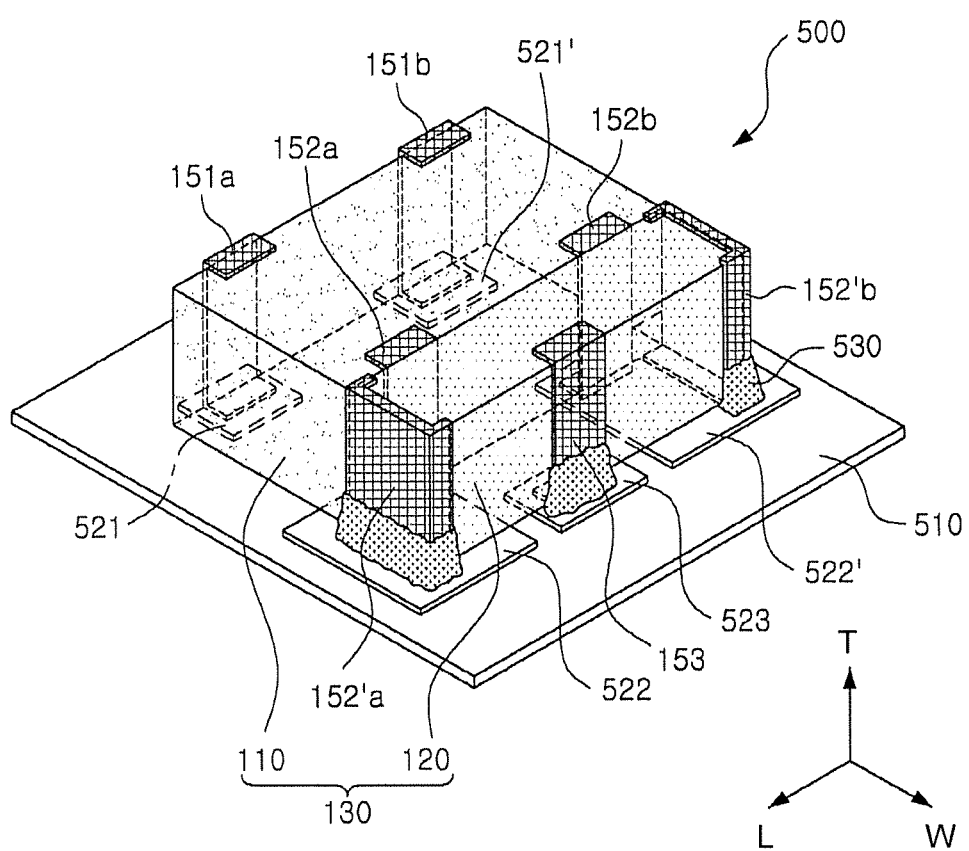
FIG. 5 is a perspective diagram illustrating a board in which the composite electronic component of FIG. 1 is mounted on a printed circuit board.

FIG. 5 is a perspective diagram illustrating a form in which the composite electronic component of FIG. 1 is mounted on a printed circuit board.

Referring to FIG. 5, a board 500 having a composite electronic component, according to the exemplary embodiment in the present disclosure, may include a printed circuit board 510 on which the composite electronic component is mounted and a plurality of electrode pads 521, 521', 522, 522' and 523 are disposed on an upper surface of the printed circuit board 510.

The electrode pads may be composed of first to fifth electrode pads 521, 521', 522, 522' and 523 connected to the input terminals 151a and 151b, the output terminals 152a, 152b, 152'a, and 152'b, and the ground terminal 153 of the composite electronic component, respectively.

In this case, the input terminals 151a and 151b, the output terminals 152a, 152b, 152'a, and 152'b, and the ground terminal 153 of the composite electronic component may be electrically connected to the printed circuit board 510 by solders 530 in a state in which the input terminals 151a and 151b, the output terminals 152a, 152b, 152'a, and 152'b, and the ground terminal 153 are positioned on the first to fifth electrode pads 521, 521', 522, 522' and 523 so as to come in contact with each other, respectively.

In detail, the first output terminal 152a disposed on the second side surface of the common mode filter 110 in the width direction and the third output terminal 152'a disposed on one end surface of the resistor 120 in the length direction may be disposed on the third electrode pad 522 at the time of mounting the composite electronic component on the printed circuit board 510, such that the first output terminal 152a and the third output terminal 152'a may be electrically connected to each other.

Similarly, the second output terminal 152b disposed on the second side surface of the common mode filter 110 in the width direction and the fourth output terminal 152'b disposed on the other end surface of the resistor 120 in the length direction may be disposed on the fourth electrode pad 522' at the time of mounting the composite electronic component on the printed circuit board 510, such that the second output terminal 152b and the fourth output terminal 152'b may be electrically connected to each other.

A description of features of the board having a composite electronic component, according to another exemplary embodiment in the present disclosure, overlapped with those of the composite electronic component according to the exemplary embodiment as described above will be omitted in order to avoid an overlapping description.

As set forth above, according to exemplary embodiments in the present disclosure, the composite electronic component having the decreased component mounting area in the tablet LCD to which the differential transmission scheme is applied, and decreased manufacturing costs, may be provided.

In addition, the composite electronic component in which common mode noise may be removed in the tablet LCD to which the differential transmission scheme is applied may be provided.

While exemplary embodiments have been shown and described above, it will be apparent to those skilled in the art that modifications and variations could be made without departing from the scope of the present invention as defined by the appended claims.

What is claimed is:

1. A composite electronic component comprising:
a composite body including a common mode filter and a resistor that are coupled to each other, the common mode filter including a common mode choke coil,
wherein the common mode filter and the resistor each have a hexahedral shape including a mounting surface, side surfaces perpendicular to the mounting surface, and end surfaces perpendicular to the mounting surface and the side surfaces; and
a plurality of input terminals, a plurality of output terminals, and a ground terminal, wherein the plurality of input terminals are disposed on one of the side surfaces of the common mode filter,
wherein the common mode filter and the resistor are coupled to each other by a conductive adhesive.

2. The composite electronic component of claim 1, wherein the resistor is a resistor array including a plurality of resistors.

3. The composite electronic component of claim 1, wherein the plurality of input terminals includes first and second input terminals disposed to be spaced apart from each other, each being connected to the common mode choke coil.

4. The composite electronic component of claim 1, wherein the plurality of output terminals includes first and second output terminals disposed to be spaced apart from each other on a second side surface of the side surfaces of the common mode filter and third and fourth output terminals disposed on both end surfaces of the resistor, the first and second output terminals each being connected to the common mode choke coil.

5. The composite electronic component of claim 1, wherein the ground terminal is disposed on one of the side surfaces of the resistor.

6. A composite electronic component comprising:
composite body including a common mode filter and a resistor that are coupled to each other, the common mode filter including a common mode choke coil,
wherein the common mode filter and the resistor each have a hexahedral shape including a mounting surface, side surfaces perpendicular to the mounting surface, and end surfaces perpendicular to the mounting surface and the side surfaces; and
a plurality of input terminals, a plurality of output terminals, and a ground terminal, wherein the plurality of input terminals are disposed on one of the side surfaces of the common mode filter,
wherein the resistor is disposed on a second side surface of the side surfaces of the common mode filter.

7. The composite electronic component of claim 6, wherein the resistor is a resistor array including a plurality of resistors.

8. The composite electronic component of claim 6, wherein the plurality of input terminals includes first and second input terminals disposed to be spaced apart from each other, each being connected to the common mode choke coil.

9. The composite electronic component of claim 6, wherein the plurality of output terminals includes first and second output terminals disposed to be spaced apart from each other on the second side surface of the side surfaces of the common mode filter and third and fourth output terminals disposed on both end surfaces of the resistor, the first and second output terminals each being connected to the common mode choke coil.

10. The composite electronic component of claim 6, wherein the ground terminal is disposed on one of the side surfaces of the resistor.

11. A board having a composite electronic component, the board comprising:
a printed circuit board having a plurality of electrode pads;
the composite electronic component mounted on the printed circuit board; and
solders connecting the electrode pads and the composite electronic component,
wherein the composite electronic component includes a composite body including a common mode filter and a resistor that are coupled to each other, the common mode filter including a common mode choke coil,
wherein the common mode filter and the resistor each have a hexahedral shape including a mounting surface, side surfaces perpendicular to the mounting surface, and end surfaces perpendicular to the mounting surface and the side surfaces; and a plurality of input terminals, a plurality of output terminals, and a ground terminal, wherein the plurality of input terminals are disposed on one of the side surfaces of the common mode filter,
wherein the common mode filter and the resistor are coupled to each other by a conductive adhesive.

12. The board of claim 11, wherein the resistor is a resistor array including a plurality of resistors.

13. The board of claim 11, wherein the ground terminal is disposed on one of the side surfaces of the resistor.

14. The board of claim 11, wherein the plurality of input terminals includes first and second input terminals disposed to be spaced apart from each other, each being connected to the common mode choke coil.

15. The board of claim 11, wherein the plurality of output terminals includes first and second output terminals disposed to be spaced apart from each other on a second side surface of the side surfaces of the common mode filter and third and fourth output terminals disposed on both end surfaces of the resistor, the first and second output terminals each being connected to the common mode choke coil.

16. The board of claim 15, wherein the first and third output terminals are disposed on one electrode pad, and the second and fourth output terminals are disposed on another electrode pad.

* * * * *